(12) United States Patent
Jamalabad et al.

(10) Patent No.: US 6,574,633 B1
(45) Date of Patent: Jun. 3, 2003

(54) METHOD FOR DYNAMICALLY GROUPING LIMITED RANGE PHYSICAL ENTITIES IN A TOPOLOGICAL SPACE

(75) Inventors: Vikram Ramesh Jamalabad, Somerville, NJ (US); Anna Loskiewicz-Buczak, Berkeley Heights, NJ (US); Richard Allen Burne, Ellicott City, MD (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/501,633

(22) Filed: Feb. 10, 2000

Related U.S. Application Data

(60) Provisional application No. 60/162,998, filed on Nov. 1, 1999.

(51) Int. Cl.$^7$ ................................................ G07F 17/30
(52) U.S. Cl. ........................ 707/102; 707/1; 707/3; 707/5; 707/100; 707/104.1
(58) Field of Search .................. 707/1–10, 100–104.1, 707/200–205; 702/188, 91–95; 709/220–224; 370/254–256; 345/744, 418, 355, 357; 706/10, 13, 15, 25, 59; 382/118, 228, 206

(56) References Cited

U.S. PATENT DOCUMENTS

| | | | |
|---|---|---|---|
| 5,613,209 A | | 3/1997 | Peterson et al. |
| 5,659,543 A | * | 8/1997 | Ater et al. ................ 370/258 |
| 5,701,467 A | * | 12/1997 | Freeston .................... 707/1 |
| 5,704,049 A | * | 12/1997 | Briechle ................. 235/383 |
| 5,784,557 A | * | 7/1998 | Oprescu ................... 370/254 |
| 6,134,532 A | * | 10/2000 | Lazarus et al. ............ 705/1 |
| 6,243,746 B1 | * | 6/2001 | Sondur et al. ............. 709/220 |
| 6,281,899 B1 | * | 8/2001 | Gould et al. .............. 345/848 |
| 6,282,532 B1 | * | 8/2001 | Sandell .................... 707/1 |

FOREIGN PATENT DOCUMENTS

| | | | | |
|---|---|---|---|---|
| EP | 0442809 | * | 8/1991 | ............... 11/22 |
| EP | 0690416 | * | 1/1996 | |
| EP | 0 700 226 A | | 3/1996 | |
| WO | WO 97/16928 | * | 5/1997 | |

OTHER PUBLICATIONS

International Search Report PCT/US00/30090; Jun. 25, 2002.

Ohler, Thomas; "The Multi Class Grid File: An Access Structure For Multi Class Range Queries"; Proceedings of the 5$^{th}$ Int. Symposium on Spatial Data Handling; vol. 1, Aug. 3–7, 1992, pp. 260–271, XP008004542; Charleston, SC USA.

* cited by examiner

Primary Examiner—Srirama Channavajjala

(57) ABSTRACT

Limited range physical entities located in a topological space are dynamically grouped by partitioning the space into grids for different functional domains, a group being associated with each grid that corresponds to a unique functional domain and a unique topological space. A range of effectiveness for each entity is determined and compared with other groups. Each entity is then assigned to be a member of a particular group. The assigning step may comprise calculating a membership value for each entity, the membership value being equal to the ratio of the intersecting space to total space within a group.

9 Claims, 9 Drawing Sheets

| GROUP | ENTITY AND MEMBERSHIP | | |
|---|---|---|---|
| | 1 | 2 | 3 |
| 1 | 0.00 | 0.00 | 0.00 |
| 2 | 0.00 | 0.00 | 0.00 |
| 3 | 0.00 | 0.00 | 0.00 |
| 4 | 0.00 | 0.00 | 0.30 |
| 5 | 0.00 | 0.00 | 0.20 |
| 6 | 0.00 | 0.00 | 0.00 |
| 7 | 0.00 | 0.00 | 0.00 |
| 8 | 0.00 | 0.10 | 0.30 |
| 9 | 0.00 | 0.00 | 1.00 |
| 10 | 0.00 | 0.00 | 0.90 |
| 11 | 0.00 | 0.00 | 0.00 |
| 12 | 0.00 | 0.20 | 0.00 |
| 13 | 0.00 | 0.50 | 0.20 |
| 14 | 0.00 | 0.00 | 0.80 |
| 15 | 0.00 | 0.00 | 0.90 |
| 16 | 0.40 | 0.00 | 0.00 |
| 17 | 0.10 | 0.00 | 0.20 |
| 18 | 0.05 | 0.00 | 0.00 |
| 19 | 0.30 | 0.00 | 0.30 |

(c)

METHOD FOR DYNAMICALLY GROUPING LIMITED RANGE PHYSICAL ENTITIES IN A TOPOLOGICAL SPACE

CROSS-REFERENCE TO RELATED APPLICATIONS

This application claims the benefit of U.S. Provisional Application No. 60/162,998, filed on Nov. 1, 1999.

GOVERNMENT RIGHTS

This invention was made with Government support under Contract No. F04701-97-C-0018 Awarded by the Defense Advance Research Project Agency. The Government has certain rights in this invention.

FIELD OF INVENTION

The present invention relates to the field of searching for physical entities or devices and more particularly to a method for grouping such physical entities or devices in a topological or physical space.

BACKGROUND OF INVENTION

In various applications, it becomes necessary to select an entity or various entities from a pool of entities to perform certain tasks within a topological area. For example, in cellular phone communications, it is necessary to determine which node is the appropriate node to carry a particular signal when the cellular phone user travels from place to place. To track the user, the cellular phone system can poll each and every node that it controls to determine which node is appropriate for the present location of that user.

Another example of locating physical entities in a physical space arises from the desire to include sensors or physical data sensing devices in fields or other open spaces where they can be used to detect various types of activities. These data sensing devices may be located in an area if possible military activity and be positioned to detect targets, such as tanks, trucks, helicopters, or even people. At the present, such devices tend to be quite expensive and quite large. The expense presents a problem as at least three such data sensing devices are needed for accurate location of any activity and, in case one of these is defective or becomes destroyed, at least one other standby must have been positioned to allow for continued receipt of sensing data. Obviously, the more such sensing devices that can be placed out in the field, the more accurate and the better the collection of data on whatever activity is to be observed. The size becomes a problem as in most instances it is desirable that for whatever activity that is being observed. Finally, present such devices tend to work only in flat or open spaces and not in an environment such as brush or forest.

It is therefore advantageous that the data sensing devices to be placed out in the field should be small, cheap enough to be entirely expendable, and not be active devices that could alert whoever is engaged in the activity to be observed that they are being observed. However, problems arise with the handling of such a large number of sensing devices. The problems involve the selection process for determining which groups of devices are to be active at a given time. It is therefore necessary to segment or section up the space both in terms of the space it self and the groupings of the sensor devices.

In general, such a selection process can be made more efficient by limiting the number of entities that will be searched. The distribution of entities in a topographical space allows for a grouping of the entities on the basis of location. The search and selection process becomes more complex when there are a number of entities distributed in a topological space which utilize different methods to perform their tasks and have differing ranges of effectiveness. The range of effectiveness of an entity for a specific function can be referred to as the entity's footprint. Specific applications can concentrate on only one method of performing a task or what can be referred to as the morphology of the entity. By concentrating on one particular morphology, the application can omit entities that perform the same function, albeit by a different method.

For example, in tracking a particular traveling object, different detection methods can include infrared, RF and visual morphologies. Concentration on only infrared methods of tracking this object can exclude a RF detector that can achieve the function of tracking that particular object. In other instances, depending on the type of object being tracked, visual detection might be unable to track the object while RF detection will accomplish that function. Thus, visual detection exists in a different functional domain than the RF detector. In addition, two different entities might utilize the same method of detection, but still have different functional domains. For example, light detectors might have different frequency ranges which would create different functional domains if the object being detected were light of a specific frequency.

Choosing a subset of entities from the whole set is a combinatorial optimization problem. Almost all the relevant classes of combinatorial optimization problems are NP hard. NP hard problems typically lead to time-consuming searches. Reducing this search space becomes a requirement when there is a time constraint in selecting appropriate entities.

The distribution of entities in a topographical space allows for a separation of these entities on the basis of location. Space partitioning methods based on topology of morphologically different entities and Binary Space Partitioning Trees techniques are useful in limiting the areas of search based on location. In the case of the former, only the partitioning of physical space is considered for better packing of physical objects in a limited space. In the latter, search space partitioning is performed by the separation of entities that are all of different types (there is no distinction between functional and morphological characteristics and there is no concept of physical space). This invention is concerned with the functional partitioning of entities based on the type of objects the entity responds to in a physical space.

SUMMARY OF THE INVENTION

This invention utilizes standard physical space partitioning techniques along with entity characteristics to distribute them into limited size overlapping sets. Partitioning is performed based on the functionality and location of the entity rather than on the morphology of the entity. A membership value, ranging from 0 to 1, is assigned to each entity associated with each set resulting in fuzzy characteristics for the sets. Dynamic variation in the range of effectiveness of the entity is accounted for by changing the memberships of the entities to the groups based on the varying range of effectiveness. A metric can be derived from the membership value list of each entity to enable a unique single dimensional comparison of two disparate entities that are described in many dimensions.

The procedure of partitioning, in summary, is the following: a distribution of the entities in a topographical space is provided as input. The input includes the type and functionality of each entity. Further, the variation of the entity range of effectiveness is input.

First, separate grids are created for each functional attribute of the entities. The grid spacing is an independent parameter that is loosely tied to the range of the functional attribute of the particular grouping of entities. If the ranges of separate types of entities for the same functional characteristics are unequal, the smaller range is selected. The spacing parameter can be, and is, changed if required.

For each grid space of each functional attribute a fuzzy set is created. All those entities of the particular functional attribute whose range of effectiveness overlap a portion of a grid space are assigned to be members of the particular fuzzy set associated with the grid space. The membership value of the entity to that group is determined. This procedure is completed for the entire group of entities that exist in the particular space. A change in the footprint of an entity results in the entity initially being removed from membership of all groups. The assignation is then recomputed based on the aforementioned procedure.

In accordance with one embodiment of the invention, a method for dynamically grouping limited range entities in a topological space is disclosed where the method comprises the steps of: determining functional domains for each entity in the topological space; partitioning the topological space into grids wherein the partitioning step is performed on the topological space for each different functional domain that exists; associating a group with each grid that corresponds to a unique functional domain and unique topological space; ascertaining a range of effectiveness for each entity wherein the ascertaining step is performed for each functional domain to which an entity belongs; comparing the range of effectiveness of each entity with each grid space that is associated with each group for each functional domain that the entity and group share in common; assigning each entity to be a member of each group whose compared range of effectiveness intersects the compared grid space that is associated with the group; and storing the group memberships of each entity.

In accordance with another aspect of this embodiment of the invention, the method further comprises the steps of: identifying when a change of conditions for any entity occurs; the conditions including a change in function, a change in range of effectiveness and a change in location; and repeating the ascertaining, comparing, assigning and storing steps when the change occurs.

In accordance with another aspect of this embodiment of the invention, the grid dimensions for each functional domain correspond to the smallest range of effectiveness of the entities that belong to the functional domain.

In accordance with another aspect of this embodiment of the invention, the grid dimensions corresponding to the same functional domain are the same. In accordance with another aspect of this embodiment of the invention, the grid dimensions corresponding to the same functional domain are determined independent of grid dimensions for different functional domains.

In accordance with another aspect of this embodiment of the invention, the assigning step further comprises the step of calculating a membership value for each entity in each group wherein the membership value is equal to the ratio of intersecting space to total space within the group.

In accordance with another aspect of this embodiment of the invention, the storing step stores the membership values of each entity for each group.

In accordance with another aspect of this embodiment of the invention, the repeating step is performed for only the entities in which a change in conditions has occurred.

In accordance with another embodiment of this embodiment of the invention, a method for dynamically grouping limited range entities in a topological space is disclosed where the method comprises the steps of determining functional domains and range of effectiveness in each functional domain for each entity in the topological space; partitioning the topological space into functional grids wherein each grid corresponds to a unique functional domain and topological space; and assigning each entity to be a member of a group whose range of effectiveness intersects the space of a functional grid and the entity and grid share the same functional domain.

In accordance with another embodiment of this embodiment of the invention, a device to dynamically group limited range entities in a topological space, comprising a data processor; the processor including a domain determiner to ascertain functional domains for each entity in the topological space; a partitioner to separate the topological space into grids for each functional domain; an identifier to assign each grid that has a unique functional domain and topological space to a unique group; a footprint determiner to ascertain the range of effectiveness of each entity for each functional domain that the entity belongs to; a comparator to compare the range of effectiveness of each entity with the space of each group when the entity and group share the same functional domain; an assignor to assign each entity as a member of each group whose range of effectiveness intersects the space of each the group; and a membership storer to store the group memberships in a memory storage device.

DESCRIPTION OF THE INVENTION

Figure 1:
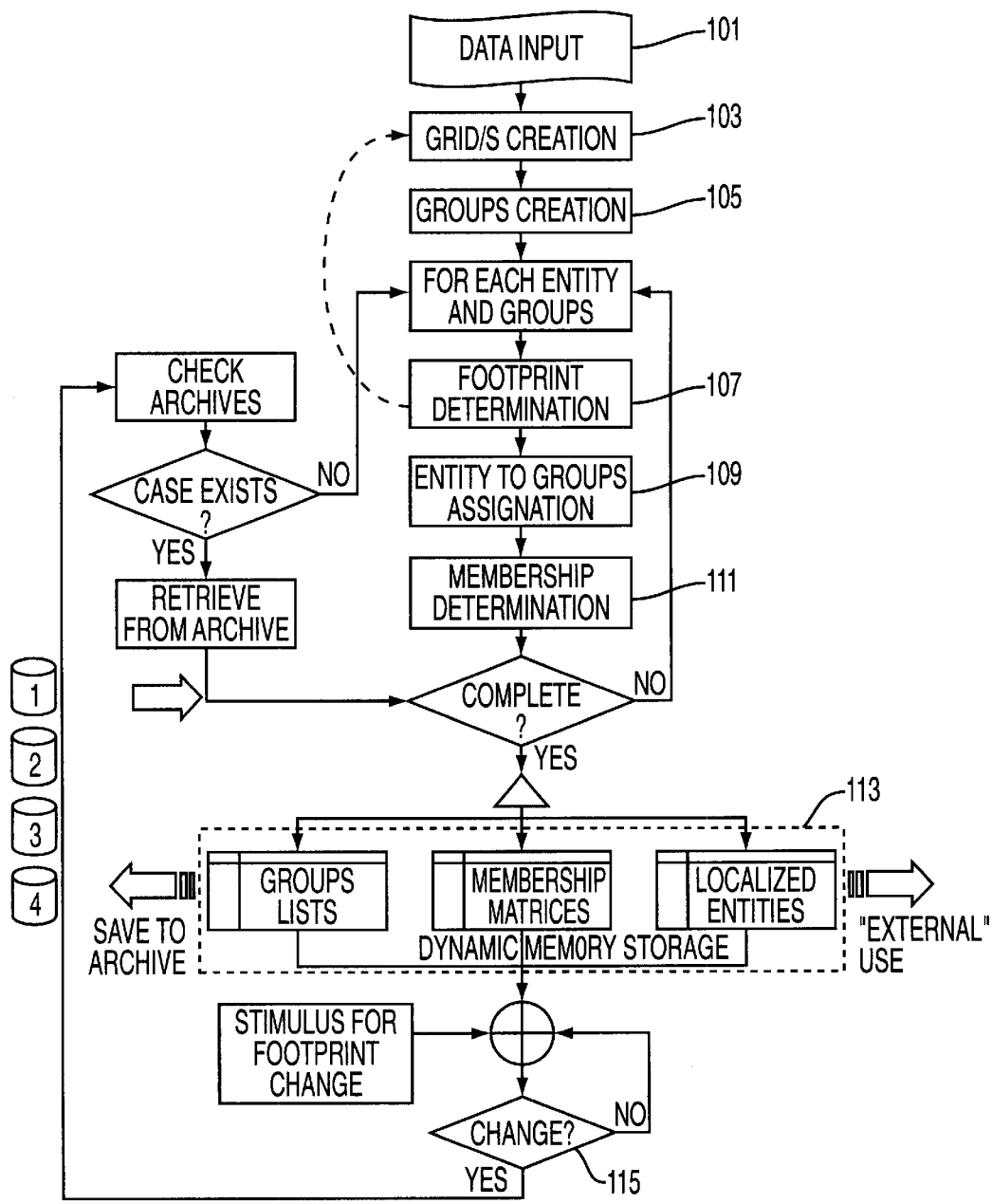
FIG. 1 is a schematic representation of a procedure of one embodiment of the present invention.

FIG. 1 illustrates a flow chart that shows one embodiment of the present invention that can be utilized on a data processor or computer. Referring to FIG. 1, the step of data input 101 is necessary to establish the working parameters and requires all the relevant information about the topological space in which the partitioning is to occur. The specific information regarding the footprint of each physical entity or data sensing device is not required at this stage. The required input is at this stage includes:

1) The topological description of the space of distribution in 3 dimensions, unchanging with time.
2) The number of functional domains that exist in the 3 dimensional space.
3) Initial estimates of the functional domain spacing.
4) A scaling factor for each functional domain that the entities are viable. This is used to determine the grid spacing. If this is not provided, the factor may be assumed to be 1.
5) The total number of entities distributed in the space at a given time.
6) A description of each entity, including its functionality.
7) The location or approximate location of each entity.

With this input, the subject space can now be partitioned as indicated in the grid creation step 103. For each functional domain, the subject space is partitioned according to the initial estimates of the functional domain spacing. The number of partitions in each dimension is a whole number and the dimensions of each grid space are equal to the dimensions of all the grid spaces in that functional domain. The effective dimension of each grid space is less than or equal to the initial estimate times the scaling factor specified for each functional domain.

Figure 2:
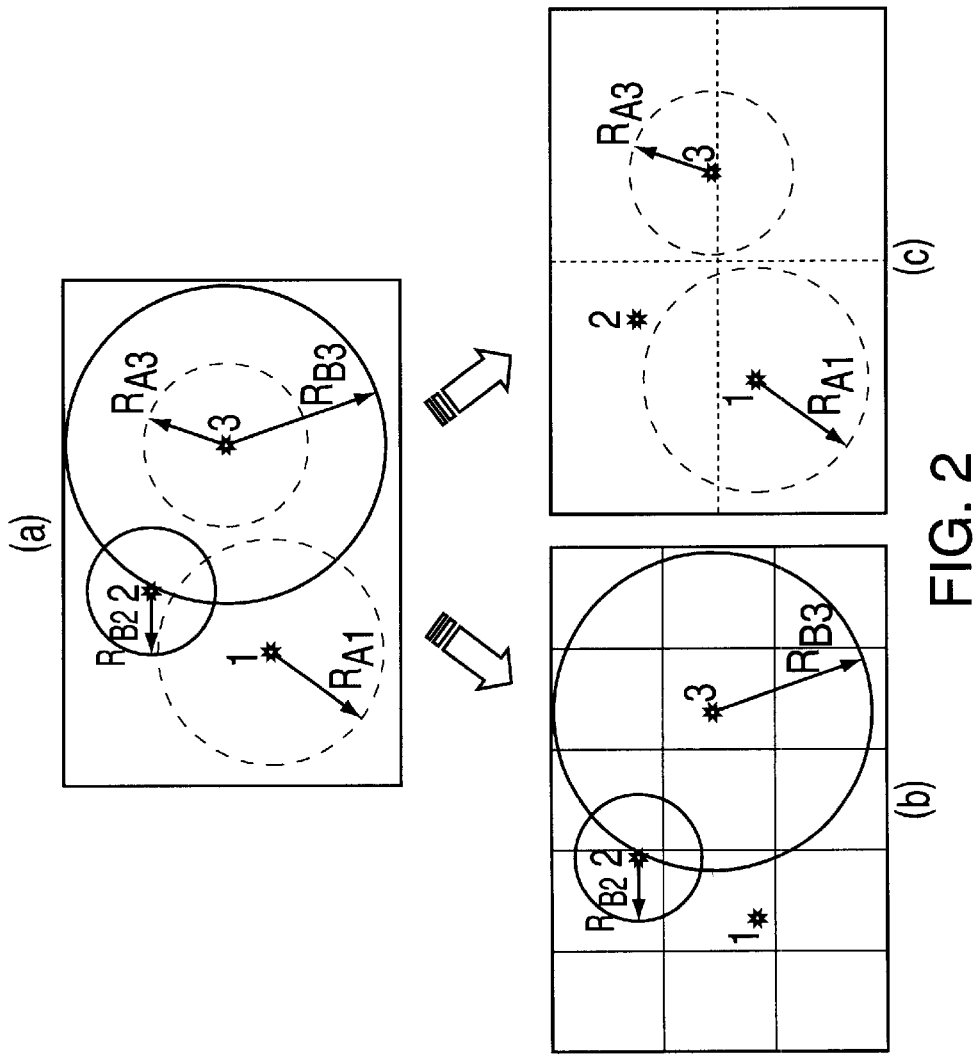
FIG. 2 is an example that depicts the steps of footprint determination and grid creation developed in accordance with the present invention.

FIGS. 2(a)–(c) shows an example of the grid creation step that depicts three entities in a two-dimensional space. Although a two dimensional space is utilized for illustrative purposes in FIG. 2, it is understood that the application of this procedure can be utilized in three-dimensional space. Referring to FIG. 2, entities 1 and 2 are viable in one functional domain each, these domains not being the same. Entity 1 has the functional domain of A while entity 2 has the functional domain of B. The circle around each entity represents the entities' footprints. Entity 3 with viability in both functional domains, A and B, is shown with two footprints, one for each domain.

Grid overlays are made for each functional domain. In FIGS. 2(b) and (c) grid overlays are shown for the two functional domains. FIG. 2(b) shows the overlay for the first domain and FIG. 2(c) shows the grid overlay for the second domain. For the functional domain B, the grid size results in a 5 by 3 grid while functional domain A results in a 2 by 2 matrix. Additionally, in these figures, only those entity footprints that are viable in the relevant domains are shown. Consequently, entity 1 is seen to have no footprint or activity in functional domain B and entity 2 has no footprint or activity in functional domain A. Entity 3 is active in both domains and has separate footprints for both.

The dimensions of grid spaces across functional domains are not related and may differ. An optional means of partitioning the grid space is to use binary space partition trees. This will enable a marginally faster search through the partitioned data spaces. However, this is not relevant to the issue of assigning entities to partitioned sets. This invention includes partitioning procedures such as binary space partitioning trees or quad- and oct-trees. However, for the sake of simplicity, only the linear partitioning and entity assignation procedure is described.

Referring back to FIG. 1, the next step 105 is group creation in which a group is associated with each grid space. The group characteristics are then assigned, prior to any entity membership determination. Group characteristics can include the following:

1) Group type, which is equivalent to the functional domain type.
2) Location, which is defined by the grid space dimensions and location.
3) Symbolic characteristics such as those that specify "internal" or "periphery" location of the associated grid space.

Referring to FIGS. 3(a)–(e), the functional domain grids that were created in FIG. 2 are now assigned. In FIGS. 3(a) and (b), the functional domain grids of FIGS. 2(b) and (c) are enumerated for reference. The numbering of the groups corresponds to the number of the grid spaces—this relationship remaining one-to-one and unchanging for the duration of the procedure. Each group number corresponds to a unique topological and functional partition. While group 1 and 16 share the same topological space they are assigned to groups differently based on the functional domain.

Referring back to FIG. 1, the footprints are then determined for each entity. A footprint is determined for each functional domain in which an entity exists. The footprint specifies the topological range of effectiveness.

The next steps are the Entity to Group Assignment step 109 and the Membership Determination step 111 wherein each entity and its footprint is compared with each group grid space. Entities are compared with only those groups in whose functional domains the entities are viable. This limits the assignation time to some degree.

The relevant footprint of the entity for the particular functional domain is utilized in determining if any portion of the footprint and group grid space intersects. If there is an overlap of these defined areas, the entity is tagged as being a member of that particular group. The membership of the entity to the group is computed as the area of overlap divided by the whole area of the associated grid space.

Figure 3:
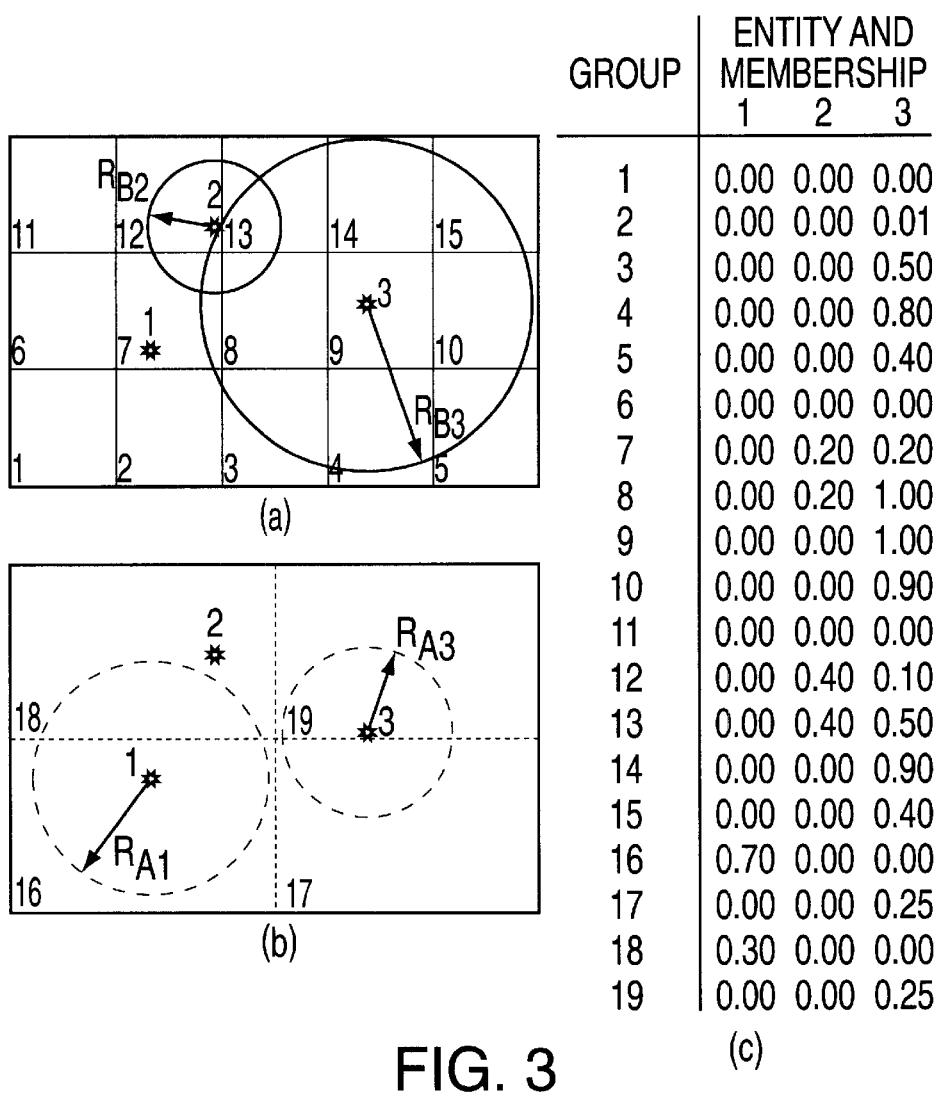
FIG. 3 is an example that depicts the steps of entity to group assignment and membership determination in accordance with the present invention.

Referring to FIG. 3, the table presented therein demonstrates Entity to Group assignment and Membership Determination results. Group assignment for each entity is followed by the computation of membership value. FIG. 3(c) has a table that lists the approximate membership values for the example shown. This value is a ratio of the volume of intersection of the footprint and grid space divided by the grid space volume. Since entity 1 only exists in the functional domain of A which has only been assigned to groups 16–19, entity 1's membership in groups 1–15 is nonexistent as represented by the value of 0.00.

Referring to FIG. 1, once the list of entities is exhausted, the lists of entities and associated membership values are stored in memory or other storage facility in a computer in step 113. This forms the core database of the rapid search procedure. This core database, however, can be changed depending on any changes in the initial conditions that were used in creating the list of entities and associated membership values. Such changes can include 1) a change in the footprint of an entity or 2) a change in location of a particular entity.

To accommodate these changes, a set of flags is maintained that determines whether the situation requires one or more of the entities to behave in a manner that is divergent from that which is currently in operation. The switching of any of these flags triggers a re-evaluation of the particular entity or set of entities as indicated by decision box 115 in FIG. 1.

A change in the footprint, which may be a characteristic of the entire set, would cause the entire set of entities for the particular functional domain to be re-assigned. A change in a particular entity, for example, the movement, addition or termination thereof, will cause a re-allocation for only that entity.

During operation, grid spacing stays constant, even when the flags are switched. The methodology does not exclude the possibility of altering grid spacing during the operation of the algorithm. In the current embodiment this would require a re-iteration of the algorithm from step 103 onwards, requiring the recreation of grids, re-formation of groups and reallocation of each of the entities to groups.

The dynamic maintenance of the entity allocation to the grid spaces does not preclude the storage of various scenarios in non-volatile memory. Predictable variation of entity footprints that occur frequently may be used for pre-computing the group allocation of these entities to save on repeated computation during operation of this procedure.

The dynamic variation of entity footprints and the corresponding changes in coverage and entity membership are described in FIGS. 4(a)–(d) and 5(a)–(c). FIG. 4(a) shows the original trio of entities from FIG. 2. FIG. 4(b) shows a change in the footprints for each of these entities based on some phenomenon. The source of this phenomenon may be internal or external and is not relevant to the procedure.

While the "original" grid space intersection for the first functional domain is shown in FIG. 4(c), FIG. 4(d) shows the altered footprints overlap with the grid spaces. Note that the grid spaces remain constant. The parameters that change are the membership of the entities to these groups and the associated membership values. This is shown in FIGS. 5(a) and (b) with the associated membership values in FIG. 5(c).

The creation of the group allocation database provides an easily accessible and efficiently sorted set of entities. Optimization procedures requiring a set of entities can operate more efficiently by being able to search only from a limited group of valid entities. By classifying morphologically dissimilar entities with variable, non-uniform and unequal ranges of operation into overlapping subsets of functionally similar groups, the required search among the complete set of entities available is reduced to a limited set.

Figure 6:
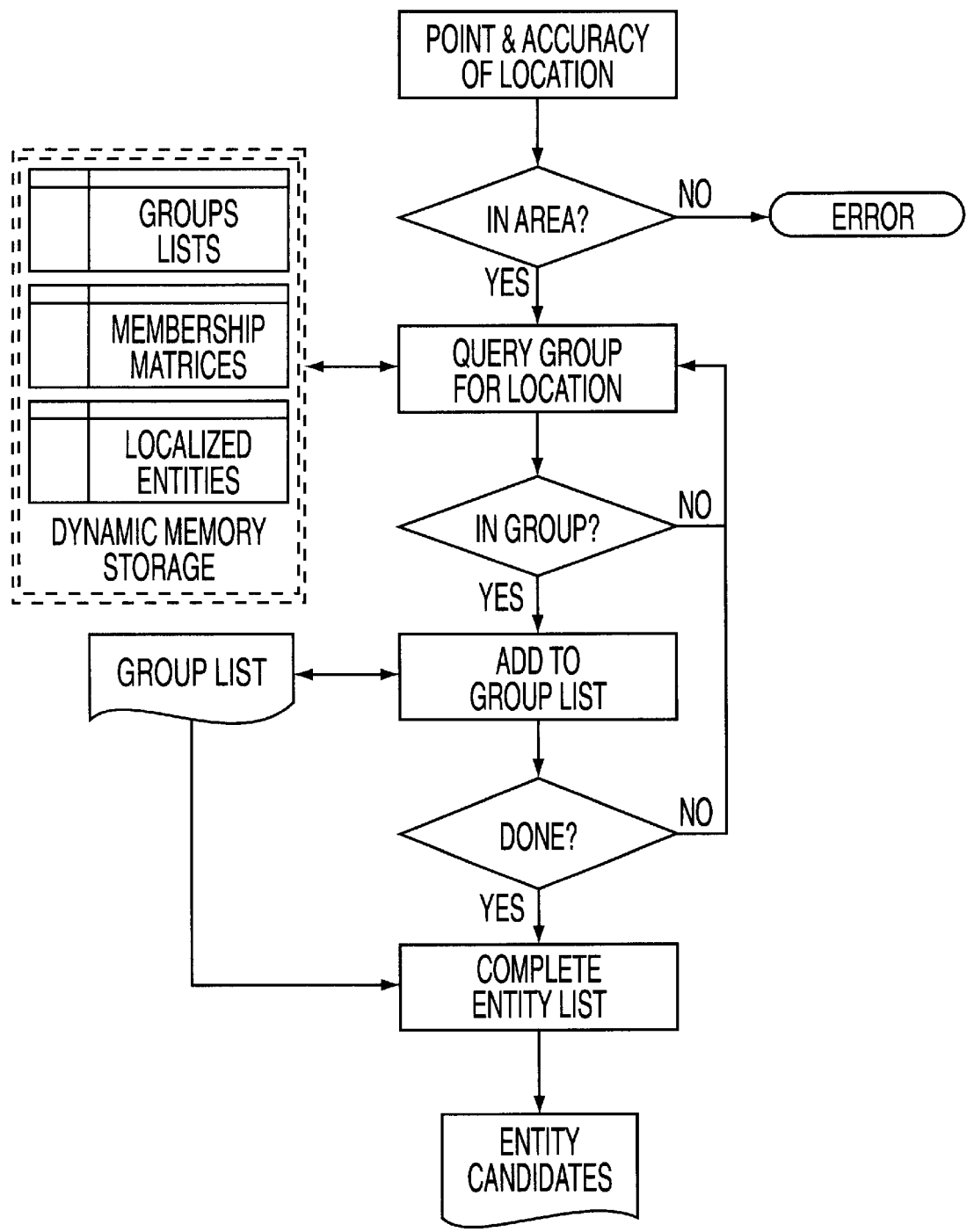
FIG. 6 is a schematic representation of a procedure developed in accordance with the present invention that scans the partition space for the relevant entities.

The application of the procedure can be seen by referring to FIG. 6. For a queried location, the uncertainty of the location being known in terms of the 3-dimensional coordinates, the procedure scans through the relevant grid spaces. For the specified functional domain, the specific group in which the queried location lies contains all the entities that are likely to be within range of the location. In the situation that the uncertainty envelope exceeds the bounds of one grid space, all the groups that refer to each of the grid spaces include possible candidate entities. For this case, the relevant groups are merged together to create an exclusive set.

The list of entities determined by the described algorithm has a higher than average likelihood of being within range of the queried location than the entire set of entities. Moreover, for the particular functional domain, only these entities in the list are possible candidates. The search order is now through a list of "M" groups, rather than "N" entities. This procedure is therefore viable where M is less than N.

The relevant search engine to determine an appropriate entity may now scan the resulting exclusive and non-repeated set of entities. Assuming that this is the "optimal" entity for the task at hand, the current techniques provide a means of ordering the remainder of the limited set according to a similarity function. This single-dimensional ordering in the multi-dimensional search space enables the search engine to select the best "alternative" entity without further computation.

The similarity function utilized (Sim (a, b)) is one of the following:

$$Sim(a, b) = 1 - \left[\sum_{i=0}^{m} \frac{|_iM_a - {}_iM_b|}{m}\right] \quad \text{Equation (1)}$$

Iff a and b belong to at least one common group.
Else, Sim(a,b)=0.
Or, $$Sim(a, b) = 1 - \left[\sqrt{\sum_{i=0}^{m} ({}_iM_a - {}_iM_b)^2 / m}\right] \quad \text{Equation (2)}$$

Iff a and b belong to at least one common group.
Else, Sim(a,b) =0.
Where:
$_iM_a$ Membership value of Entity A in the "i"th group;
$_iM_b$ Membership value of Entity B in the "i"th group;
m Total, non-repeated number of groups that Entities A or B is a member of.

Figure 7:
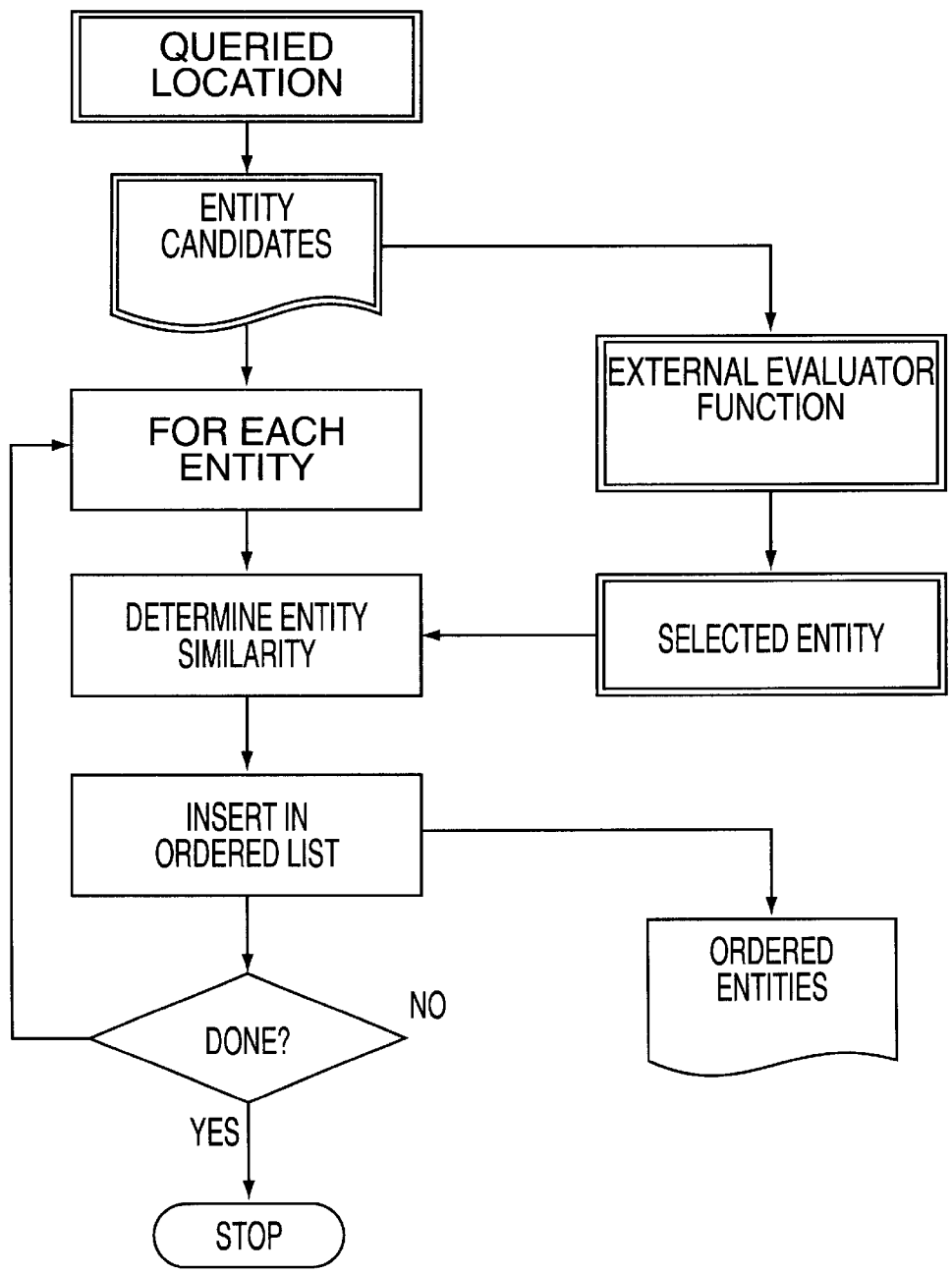
FIG. 7 is a schematic representation of a procedure developed in accordance with the present invention that will determine the entity similarities for each group.

The similarity between entities is a derived value that is indirectly determined from their partitioned group membership. Identical entities, i.e., those that have the same location, functional domains and ranges in those domains will have a similarity of 1, while those that do not belong to any common groups will have a similarity of 0. The entities in a group are ordered according to the procedure in FIG. 7.

The similarity function usage is a viable indicator for entities that are close together, ergo, those that are in the same or neighborhood groups. Entities in widely separated groups will come up with similarities of 0, regardless of distance—in essence implying that this is a metric to measure the similarity of a tuple of entities and not the dissimilarity of any tuple of entities. Entities with high similarity will be able to be substituted one for the other, when performing a given function. Entities with similarity of zero will not be able to be substituted one for the other.

Referring to the examples presented in FIGS. 2 and 3, the similarity values are represented by the following chart:

| | Chart 1 | |
|---|---|---|
| | Equation | |
| Entity pairs | (1) | (2) |
| 1 & 2 | 0.000 | 0.000 |
| 1 & 3 | 0.000 | 0.000 |
| 2 & 3 | 0.633 | 0.879 |

This function derives a single dimensional comparison between the dissimilar entities. The only existing similarity in the described example is for entities 2 and 3. This is because they are members of common groups. Entities 1 and 2 are in functionally dissimilar domains and are expected not to have any similarity whatsoever. The absence of similarity between entities 1 and 3 is again due to there being no common group for the two entities. If the grid spaces had been drawn slightly differently, common groups may have occurred. In the latter scenario, the similarity function would exist and would be allowed, even with no overlap of entity footprints. The function guarantees that a similarity of 0 corresponds to a certainty of non-intersection in entity footprints. It does not guarantee that a similarity value different than 0 corresponds to overlapping footprints.

Figure 4:
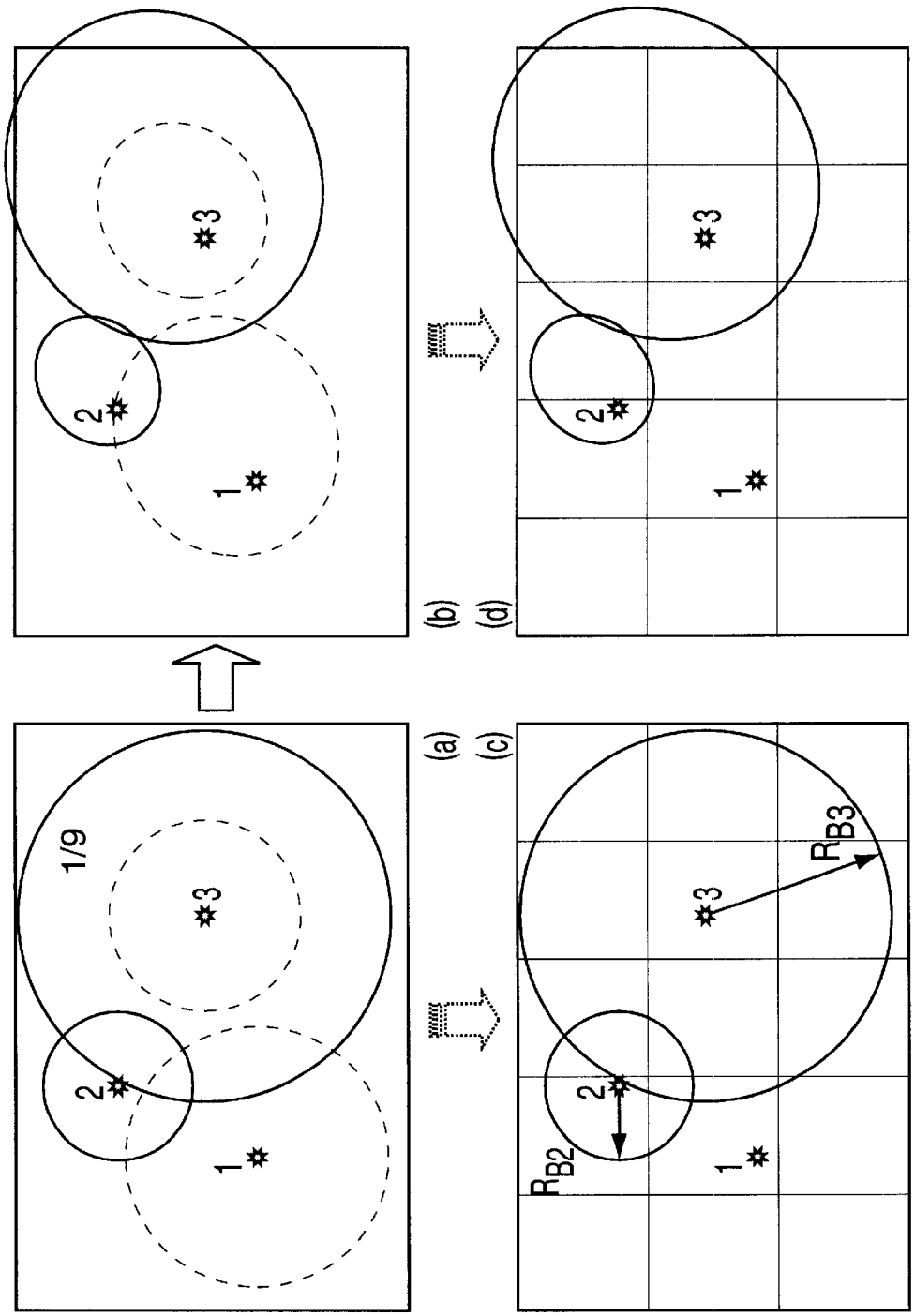
FIG. 4 is an example that depicts the steps of footprint determination and grid creation when recalculating the group assignments due to changes in conditions in accordance with the present invention.
Figure 5:
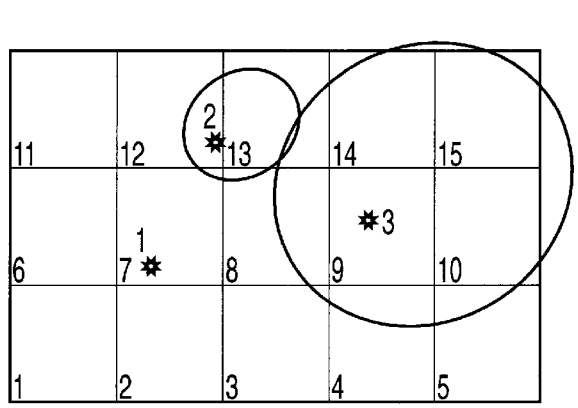
FIG. 5 is an example that depicts the steps of entity to group assignment and membership determination when recalculating the group assignments due to changes in conditions in accordance with the present invention.
Figure 5:
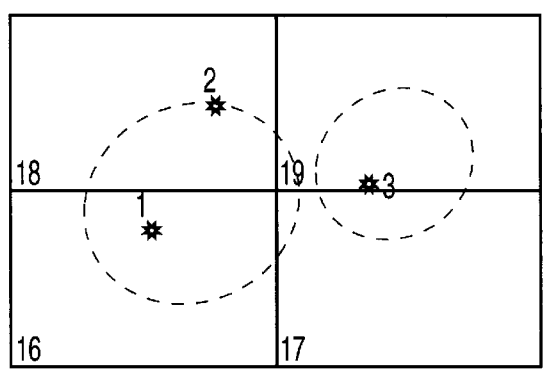

Similarly, the following chart represents the similarity values for the situation as presented in FIGS. 4 and 5:

Chart 2

| Entity pairs | Equation (1) | Equation (2) |
|---|---|---|
| 1 & 2 | 0.000 | 0.000 |
| 1 & 3 | 0.632 | 0.863 |
| 2 & 3 | 0.592 | 0.852 |

While the entity footprint overlap is minimal, the similarity of entities 2 and 3 drops only marginally. This is due to the fact that the similarity function reflects a functional, positional and coverage oriented relationship between the entities. This is further demonstrated by the appearance of a similarity value for entities 1 and 3. While there is no overlap in the entity footprints, there is an overlap in the group memberships. This is enough to create a membership value different than 0.

Having the core database of the rapid search procedure greatly simplifies the search time and speeds up the selection process, which can be seen by the following results. Faced with the problem of selecting from a set of n entities, k or fewer entities that minimize a certain metric, the size of the search space can be characterized by the following equation:

$$\binom{n}{k} = \frac{n!}{(n-k)!k!} \quad \text{Equation (3)}$$

Consider a two dimensional area, 20 units by 20 units (400 square units) in dimension that contains a randomly distributed set of morphologically and functionally identical entities. The functional range of each of these entities is a constant circle of radius 1 unit. There is no dynamic variation or multiple functionality.

A series of random entities were generated in the topological space, 100, 500, 1000 and 5000. This procedure was repeated twice to have two cases for each entity set number. The topological space was then divided, for each entity set, into firstly 400 spaces (20×20, 1 unit grid groups), then 100 (10×10, 2 unit grid groups), 25 (5×5, 4 unit grid groups) and 1 (1×1, no grid or group). The following chart indicates the average number of entities per group for each category.

CHART 3

| | | Number of groups | | |
|---|---|---|---|---|
| Entities in space (n) | 1 (i.e. none) | 25 | 100 | 400 |
| 100 | 100 | 7.36 [2–14] | 3.345 [0–8] | 1.875 [0–6] |
| 500 | 500 | 37.34 [20–56] | 16.77 [5–30] | 9.384 [0–20] |
| 1000 | 1000 | 73.44 [49–100] | 33.18 [16–54] | 18.65 [4–36] |
| 5000 | 5000 | 367.7 [271–445] | 165.6 [99–217] | 92.91 [40–124] |

The smallest and largest number of entities that were found in any group accompanies the average number of entities in parentheses. For each scenario, group allocation was performed and the average number of entities for each entity set number was determined. This was then rounded to the closest integer larger than the number. The spread indicates the lowest and highest number of entities belonging to a group.

The effective search space for each of these cases is then a search through the list of groups and then a combinatorial search through the entity list of the specific group. Since a standard search through a list of "n" length is "n/2" (it is less for a binary space partitioned procedure), the effective space for a set of entities within range of a specific point in space is:

$$\langle ListSearch \rangle + \binom{m}{k} = \frac{g}{2} + \frac{m!}{(m-k)!k!} \quad \text{Equation (4)}$$

Where:
  g: Number of groups created for the search space,
  m: Average number of entities per group,
  For default situation, with no groups exist (i.e., g=1), m=n. Due to the footprints having a finite area, the value of m is greater than n/g, unless g=1.

Assuming the desired search is for three entities, equation 4 can be written as $$\langle ListSearch \rangle + \binom{m}{3} = \frac{g}{2} + \frac{m!}{(m-3)!3!}$$

Application of this equation to the results in the above referenced table results in the following chart, which depicts the net space search for each corresponding category. The computations in the following chart round up the values in the above chart to the next integer. This rounding provides a conservative estimate to the search space, suggesting that on average the space will not exceed the values in the cells.

CHART 4

| Entities in space | Number of groups | | | |
|---|---|---|---|---|
| | 1 (i.e. none) | 25 | 100 | 400 |
| 100 | 161700 | 69 | 54 | 200 |
| 500 | 20708500 | 8449 | 730 | 320 |
| 1000 | 166167000 | 64837 | 6034 | 1169 |
| 5000 | 20820835000 | 8238429 | 748710 | 129966 |

Figure 8:
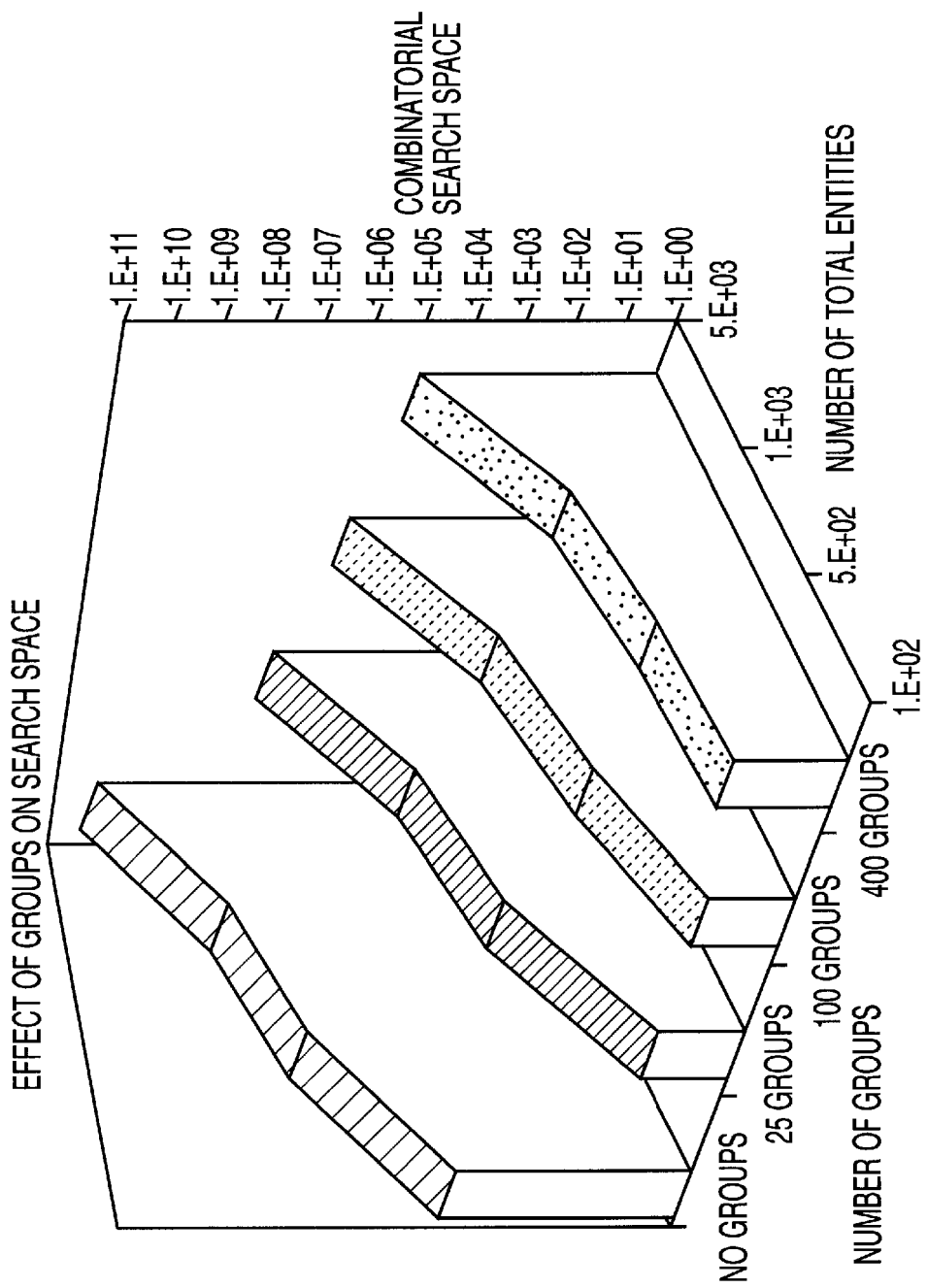
FIG. 8 is a graphical depiction of the combinatorial search space based on the number of entities and the number of groups in accordance with the present invention.
Figure 9:
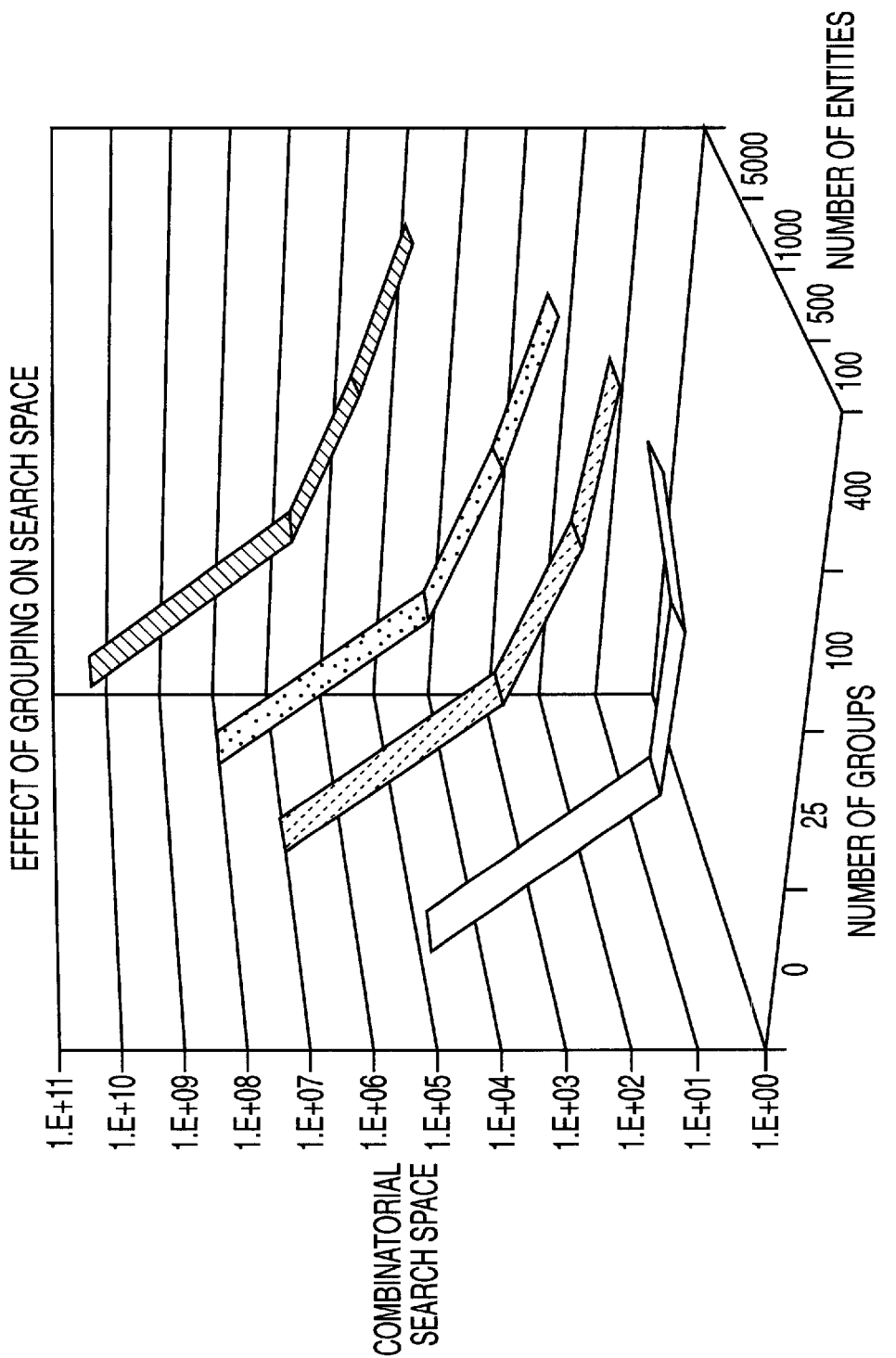
FIG. 9 is a graphical depiction of the combinatorial search space based on the number of entities and the number of groups in accordance with the present invention.

Referring to FIGS. 8 and 9, these results are graphically displayed to demonstrate the effects of this type of grouping. As can be seen in FIG. 8, four separate plots for the increase in search space are shown with no groups (farthest back), 25 groups, 100 groups and 400 groups (nearest). The up right axis marks. in logarithmic scale, the combinatorial space to be searched. FIG. 9 plots the change in the search space for each increase in groups created. With the exception of the plot for 100 entities, the combinatorial search space decrease with the creation of more groups. In the case of 100 entities, the search space becomes greater once the number of groups exceeds the number of entities. In general, the search space starts to increase for any number of entities when the number of groups exceeds the number of entities.

The present invention is not to be considered limited in scope by the preferred embodiments described in the specification. Additional advantages and modifications, which will readily occur to those skilled in the art from consideration of the specification and practice of the invention, are intended to be within the scope and spirit of the following claims.

What is claimed is:

1. A method for dynamically grouping limited range physical entities located in a topological space, comprising the steps of:

determining functional domains for each entity in said topological space;

partitioning said topological space into grids wherein said partitioning step is performed on said topological space for each different functional domain that exists;

associating a group with each said grid that corresponds to a unique functional domain and unique topological space;

ascertaining a range of effectiveness for each entity wherein said ascertaining step is performed for each functional domain to which an entity belongs;

comparing said range of effectiveness of each entity with each grid space that is associated with each group for each functional domain that the entity and group share in common;

assigning each entity to be a member of each group whose compared range of effectiveness intersects the compared grid space that is associated with the group, said assigning step comprising the step of calculating a membership value for each entity in each group wherein said membership value is equal to the ratio of intersecting space to total space within said group; and storing said group memberships of each entity.

2. A method as claimed in claim 1, further comprising the steps of:

identifying when a change of conditions for any entity occurs, said conditions including a change of function, a change in range of effectiveness and a change in location; and repeating said ascertaining, comparing, assigning and storing steps when said change occurs.

3. A method as claimed in claim 2, wherein said repeating step is performed for only said entities in which a change in conditions have occurred.

4. A method as claimed in claim 1, wherein grid dimensions corresponding to the same functional domain are the same.

5. A method as claimed in claim 4, wherein said grid dimensions corresponding to the same functional domain are determined independent of grid dimensions for different functional domains.

6. A method as claimed in claim 1, wherein grid dimensions for each functional domain correspond to the smallest range of effectiveness of said entities that belong to said functional domain.

7. A method as claimed in claim 1, wherein said storing step stores the membership values of each entity for each group.

8. A method as claimed in claim 1, wherein said physical entities are data sensing devices.

9. A method for dynamically grouping a plurality of data sensing devices located in a physical space, said method comprising the steps of:

determining functional domains and range of effectiveness in each functional domain for each said data sensing device in said physical space;

partitioning said physical space into functional grids wherein each said grid corresponds to a unique functional domain and physical space; and assigning each said data sensing device to be a member of a group whose range of effectiveness intersects the space of a functional grid, said data sensing device and said grid sharing the same functional domain and said assigning step including calculating a membership value for each device in each group wherein said membership value is equal to the ratio of the intersecting space to total space within said group.

* * * * *